(12) United States Patent
Lin

(10) Patent No.: US 7,714,334 B2
(45) Date of Patent: May 11, 2010

(54) POLARLESS SURFACE MOUNTING LIGHT EMITTING DIODE

(76) Inventor: Peter P. W. Lin, 235 Chung-Ho Box 8-24, Taipei (TW)

( * ) Notice: Subject to any disclaimer, the term of this patent is extended or adjusted under 35 U.S.C. 154(b) by 87 days.

(21) Appl. No.: 11/839,548

(22) Filed: Aug. 16, 2007

(65) Prior Publication Data
US 2009/0045428 A1    Feb. 19, 2009

(51) Int. Cl.
*H01L 29/267* (2006.01)
(52) U.S. Cl. .................... 257/81; 257/E33.057
(58) Field of Classification Search .......... 257/81, 257/98, 99, 100, E33.057, E33.058, E33.059, 257/91, E33.066; 313/231.61, 291; 315/224; 362/219, 222, 236, 237, 368, 800
See application file for complete search history.

(56) References Cited
U.S. PATENT DOCUMENTS
6,093,940 A * 7/2000 Ishinaga et al. ............ 257/99

| 6,318,886 B1 * | 11/2001 | Stopa et al. ............ 362/555 |
| D511,328 S * | 11/2005 | Wang et al. ............ D13/180 |
| 7,165,863 B1 * | 1/2007 | Thomas et al. .......... 362/219 |
| 2008/0218095 A1 * | 9/2008 | Erhardt ................ 315/224 |

* cited by examiner

*Primary Examiner*—Davienne Monbleau
*Assistant Examiner*—Shweta Mulcare
(74) *Attorney, Agent, or Firm*—Winston Hsu

(57) ABSTRACT

A polarless surface mounting light emitting diode comprises a substrate; an upper surface of the substrate being etched with four independent metal thin film blocks; a lower surface of the substrate being formed with two independent metal thin film blocks; two ends of the substrate being formed with electroplated through holes; a plurality of metal thin films adhered upon the upper and lower surfaces of the substrate; two light emitting assemblies, each light emitting assembly being formed by a chip resistor and a chip light emitting diode; and a package layer. The connection of the polarless surface mounting light emitting diode of the present invention is not limited by the polarity. Any end of the polarless surface mounting light emitting diode can be connected to positive electrode or negative electrode.

3 Claims, 3 Drawing Sheets

POLARLESS SURFACE MOUNTING LIGHT EMITTING DIODE

FIELD OF THE INVENTION

The present invention relates to diodes, and particularly to a polarless surface mounting light emitting diode, wherein the connection of the polarless surface mounting light emitting diode of the present invention is not limited by the polarity. Any end of the polarless surface mounting light emitting diode can be connected to positive electrode or negative electrode.

BACKGROUND OF THE INVENTION

In a prior art surface mounting light emitting diode, one end of the diode is a P type junction surface and another end thereof is an N type junction surface. The P type junction surface is connected to a positive electrode and the N type junction surface is connected to a negative electrode. The diode is operated by positive bias so that the surface mounting light emitting diode can light up. If the P type junction surface is connected to a negative electrode and the N type junction surface is connected to a negative electrode, then the diode is negative biased to that the diode will be in cut off mode and thus it can not light up.

Thus, in the prior art surface mounting light emitting diode, the diode must be connected by a predetermined direction. In application, it must be in positive bias state for application. If the connect is incorrect, the diode can not operate. The prior art surface mounted light emitting diode only support voltages of 3V to 5VF. If it is applied to a higher voltage, it must be externally connected to a lower voltage. If it is applied to a loop of high voltage, a shunt resistor must be externally connected thereto. As a result, not only the complexity in circuit design is increased, but also the cost is also increased.

SUMMARY OF THE INVENTION

Accordingly, the primary object of the present invention is to provide a polarless surface mounting light emitting diode, wherein the connection of the polarless surface mounting light emitting diode of the present invention is not limited by the polarity. Any end of the polarless surface mounting light emitting diode can be connected to a positive electrode or a negative electrode.

In the present invention, the voltage applied to the light emitting assembly is varied with the resistor of a chip resistor. The chip resistor is a silicon resistor chip. An equivalent formula is that $VL = I \cdot R + VF$, where VL is the voltage applied thereto. I is a maximum current of the silicon resistor chip, R is the resistor of the silicon resistor chip and VF is a forward bias of a light emitting diode.

To achieve above objects, the present invention provides a polarless surface mounting light emitting diode, comprising: a substrate having two surfaces which are adhered with copper foil metal thin films by thermal pressing; an upper surface of the substrate being etched with four independent metal thin film blocks; a lower surface of the substrate being formed with two independent metal thin film blocks; two ends of the substrate being formed with a left electroplated through hole and a right electroplated through hole, respectively; a plurality of metal thin films adhered upon the upper and lower surfaces of the substrate, and the metal thin films at upper surface and lower surfaces of the substrate are electrically connected; the metal thin films on the upper surface being etched as a left independent metal thin film block, a right independent metal thin film block, an upper independent metal thin film block and a lower independent metal thin film block; the metal thin films on the lower surface of the substrate being etched as a left metal thin film block and a right metal thin film block; by the left electroplated through hole and the right electroplated through hole, the left independent metal thin film block and right independent metal thin film block are electrically connected to the left metal thin film block and right metal thin film block, respectively; the left independent metal thin film block and right independent metal thin film block being connected to two light emitting assemblies, and each light emitting assembly is formed by a chip light emitting diode and a chip resistor; by thermal supersonic welding technology, four conductive wires are welded respectively to electrically connect the chip resistor and the chip light emitting diode of one of the light emitting assemblies to the upper independent metal thin film block and electrically connect the chip resistor and the chip light emitting diode of the other one of the light emitting assemblies to the lower independent metal thin film block so as to form a parallel equivalent circuit; the chip resistor and the chip light emitting diode of one of the light emitting assemblies are respectively fixed to the left independent metal thin film block and right independent metal thin film block at the upper surface of the substrate by using conductive glue, and the chip resistor and the chip light emitting diode of the other one of the light emitting assemblies are respectively fixed to the right independent metal thin film block and the left independent metal thin film block at the upper surface of the substrate by using conductive glue; and a package layer packaged to the light emitting assemblies of the substrate for protecting the chip resistors and chip light emitting diodes.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
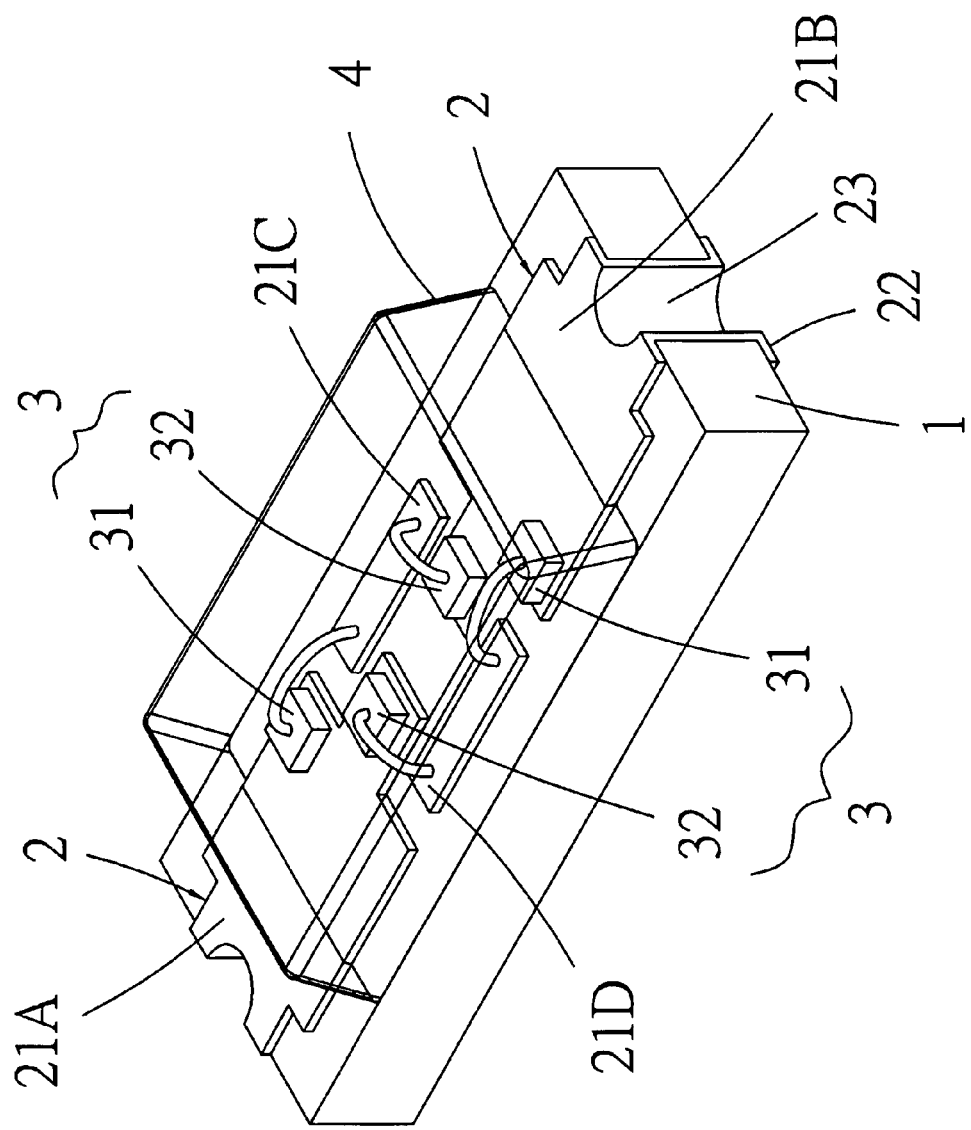
FIG. 1 shows an upper view of the present invention.
Figure 2:
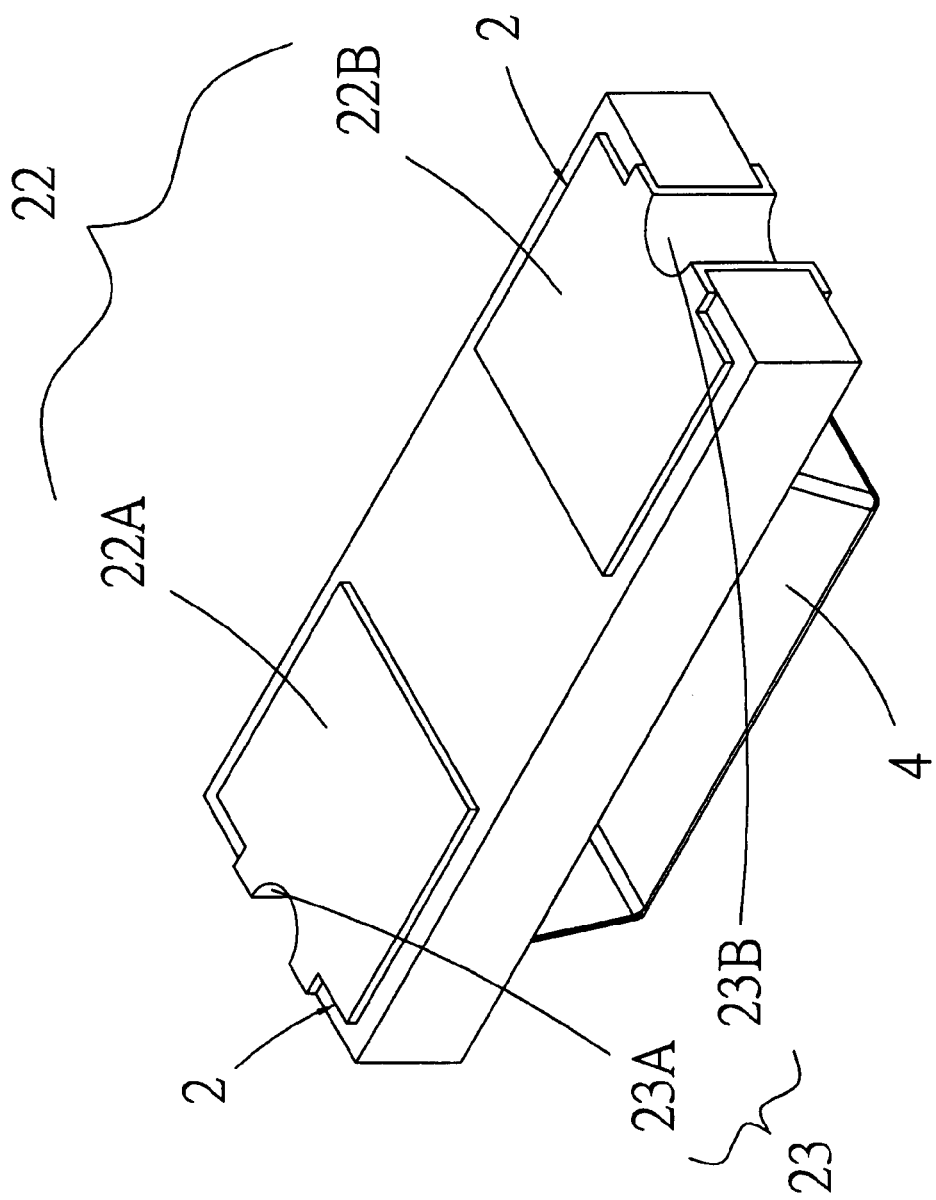
FIG. 2 shows a lower view the present invention.

Referring to FIGS. 1 and 2, the polarless surface mounting light emitting diode of the present invention is illustrated. The structure of the present invention will be described herein.

A substrate 1 has two surfaces which are adhered with copper foil metal thin films by thermal pressing. An upper surface of the substrate 1 is etched with four independent metal thin film block. A lower surface of the substrate 1 is formed with two independent metal thin film block. Two ends of the substrate 1 are formed with respective left electroplated through hole 23A and right electroplated through hole 23B so that the metal thin films at upper and lower surfaces of the substrate 1 are electrically connected.

A plurality of metal thin films 2 are adhered upon the upper and lower surfaces of the substrate 1. The metal thin films on the upper surface of the substrate 1 are etched as a left independent metal thin film block 21A, a right independent metal thin film block 21B, an upper independent metal thin film block 21C and a lower independent metal thin film block 21D. The metal thin films on the lower surface of the substrate 1 are etched as a left metal thin film block 22A and a right metal thin film block 22B. By the left electroplated through hole 23A and the right electroplated through hole 23B, the left independent metal thin film block 21A and right independent metal thin film block 21B are electrically connected to the left metal thin film block 22A and right metal thin film block 22B, respectively. The left independent metal thin film block 21A and right independent metal thin film block 21B are connected to two light emitting assemblies 3, and each of the light emitting assemblies is formed by a chip light emitting diode and a chip resistor. By thermal supersonic welding technology, four conductive wires are welded respectively to electrically connect the chip resistor 31 of one of the light emitting assemblies 3 and the chip light emitting diode 32 of the other one of the light emitting assemblies 3 to the upper independent metal thin film block 21C and electrically connect the chip resistor 31 of the light emitting assembly 3 and the chip light emitting diode 32 of the other light emitting assembly 3 to the lower independent metal thin film block 21D so as to form a parallel equivalent circuit (referring to FIG. 3).

The chip resistor 31 and the chip light emitting diode 32 of the light emitting assembly 3 are respectively fixed to the left independent metal thin film block 21A and right independent metal thin film block 21B at the upper surface of the substrate 1 by using conductive glue. The chip resistor 31 and the chip light emitting diode 32 of the other light emitting assembly are respectively fixed to the right independent metal thin film block 21B and the left independent metal thin film block 21A at the upper surface of the substrate by using conductive glue.

A package layer 4 is packaged to the light emitting assemblies 3 of the substrate 1 for protecting the chip resistors 31 and chip light emitting diodes 32.

In the polarless surface mounting light emitting diode of the present invention, two surfaces of the substrate 1 are adhered with a foil metal thin film 2 by thermal pressing. The upper surface of the substrate 1 is etched with the left independent metal thin film block 21A, right independent metal thin film block 21B, upper independent metal thin film block 21C and lower independent metal thin film block 21D. The lower surface of the substrate 1 is etched with the left metal thin film block 22A and right metal thin film block 22B. The light emitting assembly 3 is formed by the chip resistor 31 and chip light emitting diode 32. The left independent metal thin film block 21A and right independent metal thin film block 21B are fixed to the substrate 1 by conductive glue. Supersonic welding technology is used to form conductive wires on the chip resistors 31 and chip light emitting diodes 32 so as to form an equivalent circuit parallel connected to the light emitting assembly 3. The upper surface of the substrate 1 is packaged by a package layer 4 so as to form as a polarless surface mounting light emitting diode. The voltage can be applied to the diode with limitation of the polarity of the voltage, that is, in connection, the positive voltage and negative voltage can be applied to any direction of the substrate 1.

Figure 3:
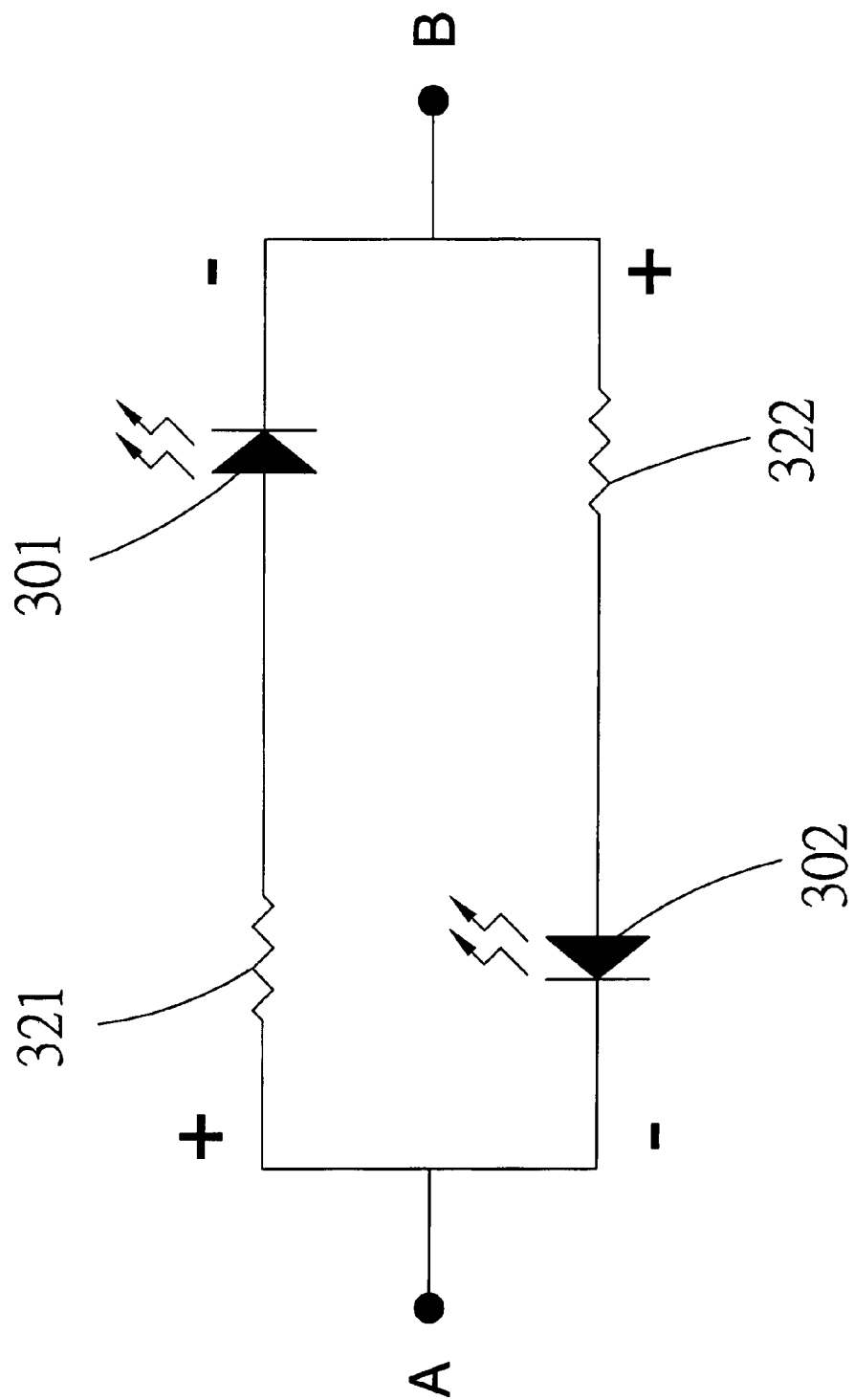
FIG. 3 shows an equivalent circuit of the present invention.

Referring to FIG. 3, the equivalent circuit of the present invention is illustrated. The chip resistors 31 are equalized as an R1 321 and an R1 322. The chip light emitting diodes 32 are equalized as an LED1 301 and an LED2 302. The left electroplated through hole 23A is equalized as point A and the right electroplated through hole 23B is equalized as point B. One set of circuit is formed by serial connection of the R1 321 and LED1 301 and another set of circuit is formed by the serial connection of R1 322 and LED2 302. The two sets are connected in parallel and with opposite polarity and two ends are connected to the A point and B point. At each connection point, the polarities of the LED1 301 and LED2 302 are opposite. When the point A is connected to a positive electrode and the point B is connected to the negative electrode, the LED1 301 is conductive and the LED2 302 is cut off and thus the LED1 301 lights up. When the point A is connected to the negative electrode and the point B is connected to the positive electrode, the LED1 301 is cut off and LED2 302 is conductive and then the LED2 302 light up. Thus, no matter than the connection of the negative electrode and positive electrode, the polarless surface mounting light emitting diode can light up.

In the present invention, the polarless surface mounting light emitting diode is a surface mounted device, the chip resistor is a silicon resistor chip and the chip light emitting diode is an LED chip.

In manufacturing, a matrix modularization production is used, that is, in a larger area substrate, by etching technology, thousands of tiny polarless surface mounting light emitting diodes are layout on the substrate 1. Then they are tied, wired and packaged and then are cut to form a plurality of independent polarless surface mounting light emitting diodes. Thus the diodes can be massively produced with a lower cost.

In application, the left electroplated through hole 23A and right electroplated through hole 23B at the lower side of the substrate 1 are connected or welded to a fuse. The two ends of the fuse are polarless. In connection of the fuse, it will not be affected by polarity. When the fuse is burned, the polarless surface mounting light emitting diode in the fuse will light up.

Advantages of the present invention will be described herein. The present invention has a compact structure. The polarless surface mounting light emitting diode is a surface mounted device (SMD). The connection of the polarless surface mounting light emitting diode of the present invention is not limited by the polarity. Any end of the polarless surface mounting light emitting diode can be connected to positive electrode or negative electrode. The present invention can be produced by semiconductor process and thus it has a tiny size. A substrate can be cut into several hundreds of diodes. Thus the cost is low and the diodes can be massively produced. The polarless surface mounting light emitting diode of the present invention can suffer from high voltages. The SMD polarless surface mounting light emitting diode of the present invention can be serially connected to a silicon resistor chip. The voltage endurable of the diode can be achieved by adjustment of the resistance of the silicon resistor chip. Moreover, the present invention has widely applications. The lower surface of the substrate can be connected or welded to a circuit, for example the polarless surface mounting light emitting diode can be used with a fuse.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A polarless surface mounting light emitting diode, comprising:
   a substrate having an upper surface and a lower surface; two ends of the substrate being formed with a left electroplated through hole and a right electroplated through hole, respectively;
   a plurality of metal thin films adhered upon the upper and lower surfaces of the substrate; the metal thin films on the upper surface of the substrate being etched as a left independent metal thin film block, a right independent metal thin film block, an upper independent metal thin film block and a lower independent metal thin film block; the metal thin films on the lower surface of the substrate being etched as a left metal thin film block and a right metal thin film block; by the left electroplated through hole and the right electroplated through hole, the left independent metal thin film block and right independent metal thin film block being electrically connected to the left metal thin film block and right metal thin film block, respectively;

two light emitting assemblies, each light emitting assembly being formed by a chip resistor and a chip light emitting diode, the chip resistor and the chip light emitting diode of one of the light emitting assemblies being respectively fixed to the left independent metal thin film block and right independent metal thin film block at the upper surface of the substrate by using conductive glue, and the chip resistor and the chip light emitting diode of the other one of the light emitting assemblies being respectively fixed to the right independent metal thin film block and left independent metal thin film block at the upper surface of the substrate by using conductive glue;

four conductive wires welded respectively to electrically connect the chip resistor and the chip light emitting diode of one of the light emitting assemblies to the upper independent metal thin film block and electrically connect the chip resistor and the chip light emitting diode of the other one of the light emitting assemblies to the lower independent metal thin film block; and a package layer packaged to the light emitting assemblies of the substrate for protecting the chip resistors and chip light emitting diodes, wherein one of the two chip resistors is serially connected to one of the two chip light emitting diodes as a first circuit set and the other one of the two chip resistors is serially connected to the other one of the two chip light emitting diodes as a second circuit set, the first circuit set is parallel connected to the second circuit set; at each connection of the two circuit sets, the two circuit sets have opposite polarities so that the polarless surface mounting light emitting diode is not limited by the polarity in connection with other elements.

2. The polarless surface mounting light emitting diode as claimed in claim 1, wherein the light emitting assemblies have the chip resistors so as to be tolerable to high voltage applied thereon and for avoiding the burning of the chip light emitting diodes.

3. The polarless surface mounting light emitting diode as claimed in claim 1, wherein the metal thin films on the lower surface of the substrate are connected to or welded to other circuit elements.

* * * * *